US005777470A

United States Patent [19]
Adler et al.

[11] Patent Number: 5,777,470
[45] Date of Patent: *Jul. 7, 1998

[54] BROADBAND PROBE FOR DETECTING THE MAGNETIC FIELD COMPONENT OF AN ELECTROMAGNETIC FIELD

[75] Inventors: Zdenek (Danny) Adler, West Hempstead; Refael Popovich, Bellmore, both of N.Y.

[73] Assignee: General Microwave Corporation, Amityville, N.Y.

[*] Notice: The term of this patent shall not extend beyond the expiration date of Pat. No. 5,512,824.

[21] Appl. No.: 613,051

[22] Filed: Mar. 8, 1996

Related U.S. Application Data

[63] Continuation-in-part of Ser. No. 260,337, Jun. 15, 1994, Pat. No. 5,512,824.

[51] Int. Cl.⁶ .................... G01R 33/02; G01R 33/025
[52] U.S. Cl. .................................. 324/258; 324/244
[58] Field of Search .............................. 324/244–258, 324/72.5, 95; 343/720, 728, 842, 866, 867

[56] References Cited

U.S. PATENT DOCUMENTS

| | | | |
|---|---|---|---|
| 3,641,439 | 2/1972 | Aslan | 325/363 |
| 3,721,900 | 3/1973 | Andrews | 324/95 |
| 3,789,299 | 1/1974 | Aslan | 324/95 |
| 3,794,914 | 2/1974 | Aslan | 324/95 |
| 3,812,438 | 5/1974 | Hopfer | 333/97 |
| 3,863,142 | 1/1975 | Werle | 324/258 |
| 3,919,638 | 11/1975 | Belden, Jr. | 324/95 |
| 3,931,573 | 1/1976 | Hopfer | 324/106 |
| 4,008,477 | 2/1977 | Babij er al. | 343/701 |
| 4,023,093 | 5/1977 | Aslan | 324/43 |
| 4,155,091 | 5/1979 | Vorie | 343/728 |
| 4,207,518 | 6/1980 | Hopfer | 324/95 |
| 4,277,744 | 7/1981 | Audone et al. | 324/72 |
| 4,305,785 | 12/1981 | Praeg | 324/258 X |
| 4,392,108 | 7/1983 | Hopfer | 324/95 |
| 4,518,912 | 5/1985 | Aslan | 324/95 |
| 4,588,993 | 5/1986 | Babij et al. | 343/351 |
| 4,631,473 | 12/1986 | Honda | 324/95 X |
| 4,634,969 | 1/1987 | Edlin et al. | 324/258 X |
| 5,256,960 | 10/1993 | Novini | 324/247 X |
| 5,319,307 | 6/1994 | Simmonds | 324/248 |
| 5,512,824 | 4/1996 | Adler et al. | 324/258 |

FOREIGN PATENT DOCUMENTS

| | | |
|---|---|---|
| 1009936 | 6/1952 | France . |
| 622211 | 4/1949 | United Kingdom . |

OTHER PUBLICATIONS

U.S. National Bureau of Standards –Isotropic Magnetic Field Meter (MFM–10) 300 Khz to MHz. J.E. Cruz, L.D. Driver, H. Kanda –Oct. 1985.

IEEE Transactions on Antennas & Propagation –The Loop Antenna as a Probe H. Whiteside and R.W.P. King –pp. 291–297, May 1964.

IEEE Transactions on Antennas & Propagation –Sensors for Electromagnetic Pulse Measurements Both Inside & Away From Nuclear Source Regions –Baum, Breen, Giles, O'Neill & Sower –pp. 22–25, Jan. 1978.

IEEE Transactions on Industrial Electronics Control Instrumentation –Precision Sensor for the Magnetic Field Intensity at Microwave & Millimeter–Wave Freequencies –F.J. Tischer, vol. 17, No. 2, Apr. 1970, pp. 185–187.

(List continued on next page.)

*Primary Examiner*—Sandra L. O'Shea
*Assistant Examiner*—Jay M. Patidar
*Attorney, Agent, or Firm*—Volpe and Koenig, P.C.

[57] ABSTRACT

An H-field probe for a radiation measuring system includes pairs of symmetrical planar magnetic loops for detecting electromagnetic (EM) radiation. EM radiation induces E-field and H-field currents in the loops. The individual loops of each pair are electrically coupled such that the E-field induced currents cancel while the H-field induced currents combine. The symmetrical construction results in virtually complete discrimination of the E-field.

20 Claims, 9 Drawing Sheets

OTHER PUBLICATIONS

IEEE Transactions on Instrumentation & Measurement – Broad–Band Isotropic Electromagnetic Radiation Monitor–Edward Aslan –vol. IM–21, No. 4, Nov. 1972, pp. 421–424.

Proceedings to the IEEE –NBS Field Strength Standards & Measurements (30 Hz to 1000 MHz), Frank M. Greene, vol. 55, No. 6, Jun. 1967, pp. 178–191.

Measurement of the Magnetic Field Very Close to an RF Source –T.M. Babij, Q. Balzano, T.J. Manning, pp. 57–60, 1994.

General Micowave, Full Line Catalog Components & Instruments 1991, pp. 178–191.

IEEE Transactions on Instrumentation & Measurment –An Ultra Broad–Band (200kHz–26 GHz)High–Sensitivity Probe–Samuel Hopfer & Zdenek Adler, vol. Im–29, No. 4, Dec. 1980.

IEEE Transaction on Electromagnetic Compatibility, vol. 35, No. 1, Feb. 1993, pp. 96–98.

IEEE Transactions on Electromagnetic Compatibility—H–Field Sensor Measurement Errors in the Near–Field of a Magnetic Dipole Source—Steven Iskra & Ian MacFarlane, vol. 31, No. 3, Aug. 1989.

BROADBAND PROBE FOR DETECTING THE MAGNETIC FIELD COMPONENT OF AN ELECTROMAGNETIC FIELD

This application is a continuation-in-part of U.S. Ser. No. 08/260,337, filed Jun. 15, 1994 now U.S. Pat. No. 5,512,824.

This invention relates generally to devices which detect electromagnetic energy. More particularly, the invention relates to a device which accurately detects and measures the magnetic field component of an electromagnetic field in the near-field region of an electromagnetic source over a wide range of frequencies.

BACKGROUND OF THE INVENTION

Electromagnetic fields (EM fields) are measured by devices which detect either the electric field (E-field) or magnetic field (H-field) components of the electromagnetic field. Conventionally, electric dipole antennas are used to detect E-fields and magnetic loops are used to detect H-fields.

In a transverse EM field, such as free space, the relationship between E- and H- fields is fixed and is independent of frequency. Under such conditions, one type of sensor may be substituted for another to determine the strength of both fields, as well as the power density. However, in the vicinity close to the source of radiation or a reflecting surface, the "near-field" region, the relationship is not fixed.

The extent of the near-field region depends on the frequency of the electromagnetic waves. At frequencies above 1000 MHZ, the region is short and for all practical purposes insignificant. At lower frequencies, where the near-field region may extend from several centimeters to hundreds of meters, measurements of both E-field and H-field components are often required.

Sensing devices may be used in close proximity to a human body, such as personal dosimeters worn on a pocket or belt. In such cases, only the H-field component can be measured reliably, since the E-field can induce surface currents in the body, which result in both absorption as well as the reflection of the rf energy.

E-field probes possess an inherent H-field discrimination, since the induced currents in the dipole antenna are due to the E-field only. In H-field magnetic loop detection, however, both H-field and E-field induced currents flow within the enclosed loop. This results in undesirable errors in measuring the H-field, since the combined rf current is dependent on the E-field polarization.

A common technique for solving the problem of undesirable E-field induced currents in H-field detectors, as disclosed in U.S. Pat. No. 4,023,093, is to shield the magnetic loops. Theoretically, E-field induced currents cannot exist within a completely shielded loop. However, in order to measure the loop current, the shield integrity must be compromised. In practice, maintaining an effective shield over a wide frequency band is problematic.

SUMMARY OF THE INVENTION

An improved H-field probe for a radiation measuring system is disclosed. The probe includes one or more pairs of symmetrical planar magnetic loops for detecting electromagnetic (EM) radiation.

EM radiation induces E-field and H-field currents in the loops. The individual loops of each pair are electrically coupled such that the E-field induced currents cancel while the H-field induced currents combine. The symmetrical construction results in virtually complete discrimination of the E-field. Multiple pairs of loops, each pair being a different size, are provided when a frequency response over a wide bandwidth is desired.

Accordingly, it is an object of the present invention to provide a radiation measuring system having an H-field probe which does not require shielding against the E-field component of an EM field.

Further objects and advantages of the invention will become apparent to those of ordinary skill in the art from the following specification and claims.

DESCRIPTION OF THE PREFERRED EMBODIMENT

Figure 1:
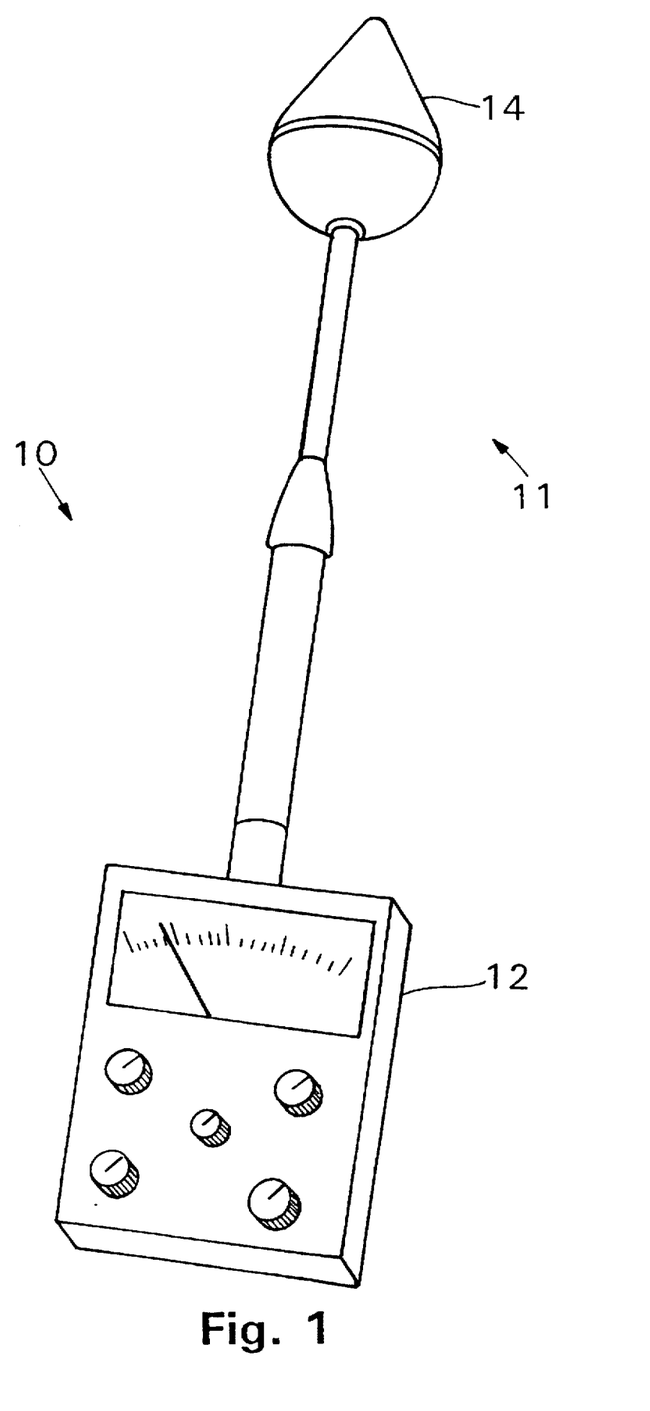
FIG. 1 is a perspective view of a radiation measuring system in accordance with the teachings of the present invention.

Referring to FIG. 1, a radiation measuring system 10 is shown which comprises a probe assembly 11 connected to a power density meter 12. The probe 11 comprises a head 14 which contains a plurality of sensors designed to provide H-field detection with improved E-field discrimination as described in detail below.

The power density meter 12 may be of conventional design. A preferred power density meter is the Model 495 Power Density Meter available from General Microwave Corporation, Amityville, N.Y. The use and calibration of the probe assembly 11 is done in a conventional manner as is done with other probes used with the Model 495 Power Density Meter which comprise the RAHAM® systems available from General Microwave Corporation.

Figure 2:
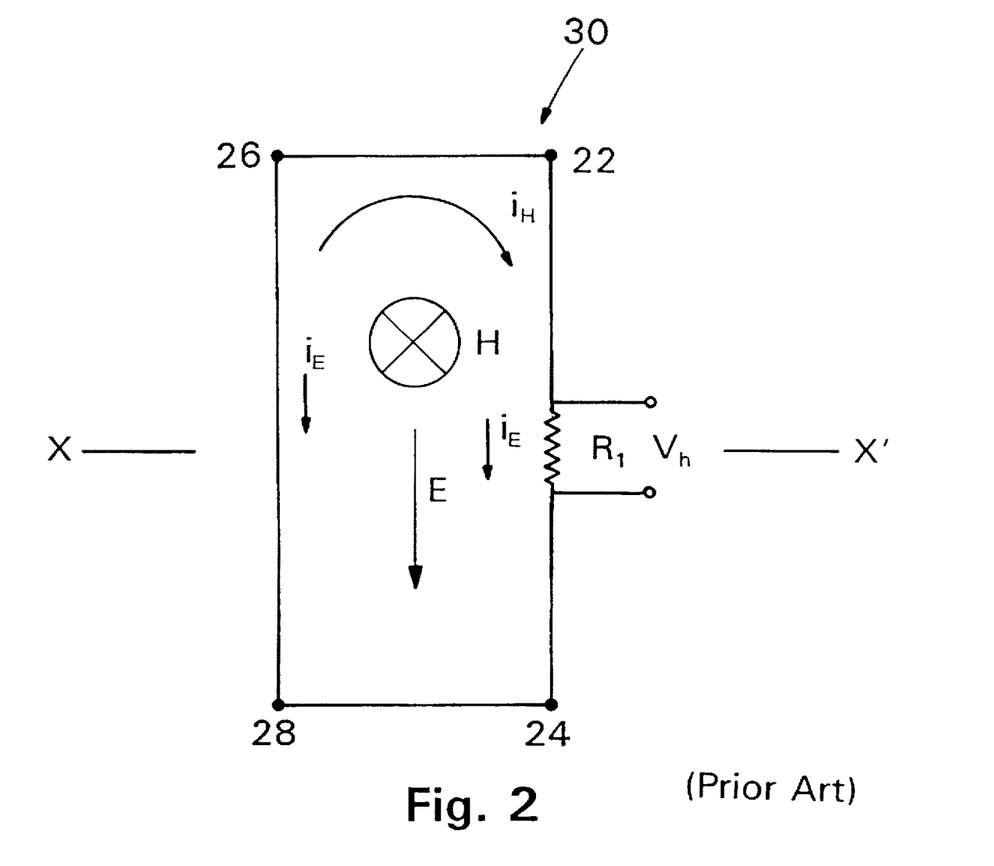
FIG. 2 is a schematic diagram of a conventional magnetic loop.

A conventional detecting circuit for an H-field probe, shown in FIG. 2, comprises a magnetic loop 30. The loop 30 is exposed to time-varying EM radiation which propagates at a velocity c. In a transverse EM field, the E- and H- fields are perpendicular to each other in the plane transverse to the direction of propagation. The magnitudes of the E- and H- fields vary along the direction of propagation, at an angular frequency ω. For explanatory purposes, as shown in FIG. 2, the loop is orientated so that the H-field is polarized in the direction normal to the plane of the loop 30. Both the E- and H- fields induce current flow within an enclosed loop. Current contributions from each of these sources must be considered for accurate measurements.

In order to simplify the analysis of the effect of the EM field upon the loop 30, several assumptions may be made. With respect to the H-field contribution, if the total circumference $l_1$ of the loop 30 does not exceed $\lambda/2$, where $\lambda=2\pi c/\omega$ is the wavelength of the EM radiation, it is assumed that the loop 30 is "electrically small". This assumption remains valid to an upper frequency limit of $\omega_2=\pi c/l_1$. The H-field induces a voltage $e_H=j\omega\mu HnA$ within the loop 30, where A is the area of the loop 30, n represents the number of turns and $\mu=4\pi\times 10^{-7}$ Henry/meter is the free space permeability.

A second assumption is that the loop 30 is lossless, which implies that the internal loop impedance is purely inductive, namely $Z_1=j\omega L_1$. The loop inductance $L_1$ depends on the shape, total loop circumference $l_1$, and cross-section of the wire comprising the loop 30. The inductance of $L_1$ can be considered a constant up to the frequency $\omega_2$. Therefore, the H-field induced loop current $i_H=e_H/Z_1=\mu HnA/L_1$ is considered to be frequency independent.

A resistor $R_1$ inserted into the loop 30 does not affect the loop current $i_H$, assuming the resistor $R_1$ is small compared to the magnitude of the loop impedance $Z_1$. The lower frequency limit of the assumption is $\omega_1=R_1/L_1$. Consequently, the rf voltage across the resistor $R_1$ is constant over the bandwidth from $\omega_1$ to $\omega_2$ and is given by Equation (1) below.

$$V_h=\mu HnA\omega_1, \omega_1 \leq \omega \leq \omega_2 \quad (1)$$

With respect to the E-field current contribution, when the E-field is polarized in the plane of the loop 30, a voltage of $e_E=El_{ef}$ is induced in the loop 30. The maximum E-field current contribution occurs when the E-field is polarized along the longer sides of the loop 30, as shown in FIG. 2. The conductive wire between the points 22 and 24 of length $l_2$ can be considered to be an electrically short dipole for which $l_{ef}=l_2/2$. Accordingly, the magnitude of the induced current $i_E$ has an essentially triangular distribution which peaks at the midpoint and vanishes at the endpoints. Given the dipole admittance of $j\omega C_a$, where $C_a$ is the coupling capacitance, the induced current at the midpoint is $i_E=j\omega C_a e_E$. The value of the capacitance $C_a$, which depends on the length of the dipole and its cross-section, can be calculated. The E-field induced voltage $V_E$ across the resistor $R_1=\omega_1 L_1$, in terms of the lower cut-off frequency $\omega_1$ and the loop parameters is given below by Equation 2:

$$V_E=j\omega C_a L_1 \omega_1 l_2/2E \quad (2)$$

As shown by Equation (2), the voltage $V_E$ is proportional to the angular frequency. Thus, the voltage across resistor $R_1$ has two components, $v_H$ and $v_E$, which are related to the contributions from the E- and H- fields. The resultant voltage $v_1$ depends on the E-field polarization and on the |E|/|H| ratio and is frequency dependent. Although in free space |E|/|H| is constant at 377Ω, the ratio can vary extensively near sources and scatterers. Measurement of H-field strength based upon an assumed constant |E|/|H| ratio is therefore unreliable. The conventional solution to this problem is to shield the loop in an attempt to eliminate the E-field interaction.

Figure 3:
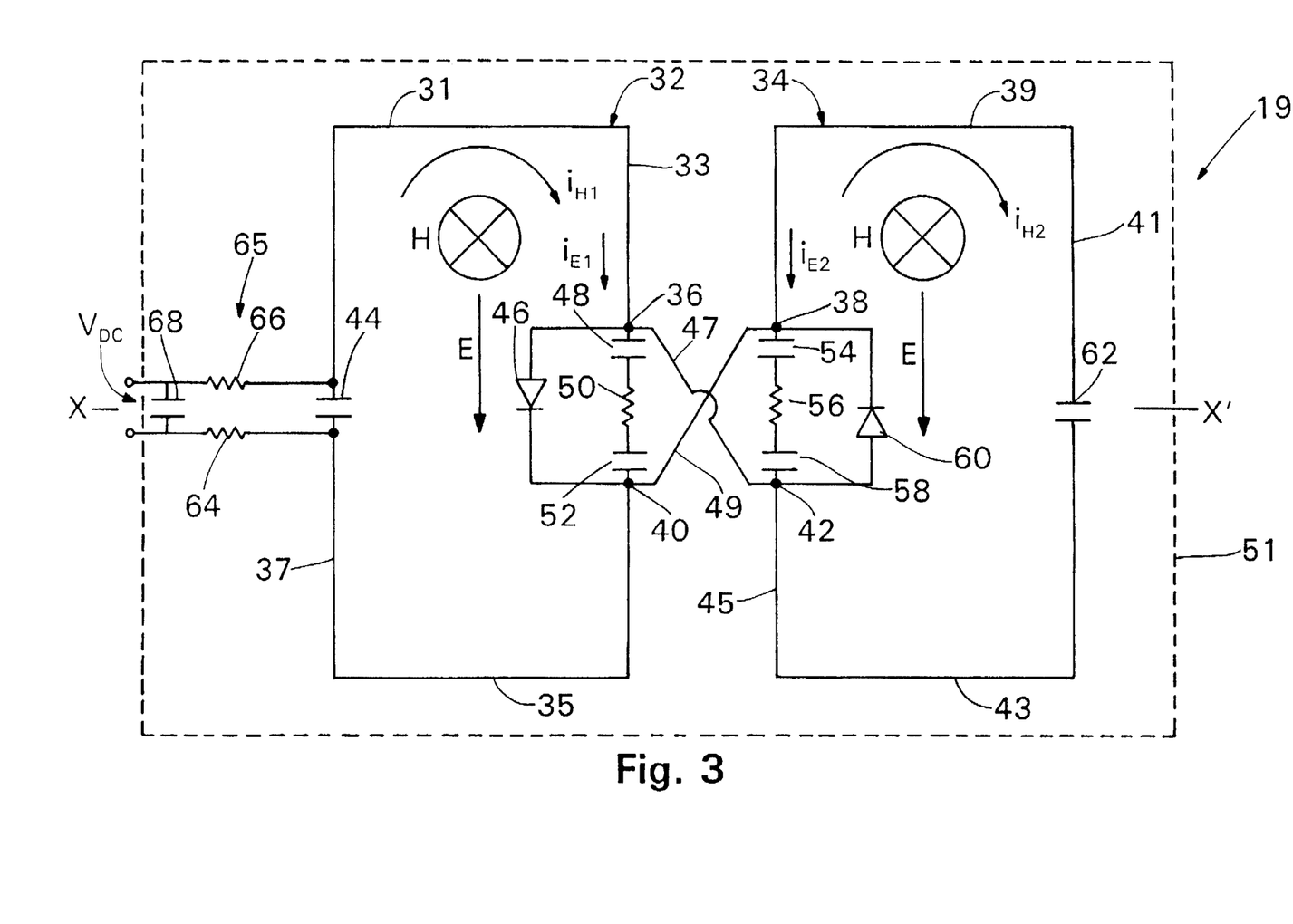
FIG. 3 is a schematic diagram of a pair of symmetrical planar magnetic loops made in accordance with the teachings of the present invention.

An H-field detector circuit 19 with enhanced E-field discrimination made in accordance with the teachings of the present invention is shown in FIG. 3. The detector circuit 19 comprises a pair of symmetrical rectangular magnetic loops 32, 34 mounted adjacent to each other on a substrate 51. Preferably, the loops 32, 34 have longer sides 33, 37, 41, 45 0.7 inches in length and shorter sides 31, 35, 39, 43 0.5 inches in length and are made of copper deposited on a substrate of Duroid® manufactured by the Rogers Company.

Each loop 32, 34 includes a resistor 50, 56 located at the mid-point of one of the longer loop sides 33, 45 in series with two capacitors 48, 52, 54, 58 on either side of each resistor 50, 56. Capacitors 44, 62 are also provided in each loop 32, 34 directly opposite the location of the resistors 50, 56. A dc measuring circuit 65, comprising two resistors 64, 66 and a capacitor 68, is connected to the pair of symmetrical loops 32, 34. The capacitors 44, 48, 52, 54, 58, 62 are used to avoid shorting the detected dc voltage $V_{dc}$.

For optimum performance, the values of the corresponding electrical elements are chosen such that the symmetry of the loops 32, 34 is maintained as precisely as possible. Example values of the various electrical elements for a probe effective in the preferred frequency range of 10 MHZ to 1000 MHZ in FIG. 3 are shown below in Table 1. The component values are selected based upon the frequency range which is desired.

TABLE 1

| ELEMENT | VALUE |
| --- | --- |
| Capacitors | |
| 44, 48, 52, 54, 58, 62, 68 | 10 nF |
| Resistors | |
| 50, 56 | 6 Ω |
| 64, 66 | 33 KΩ |

The loops 32, 34 are electrically coupled via two symmetrically located conductors 47, 49; one conductor 47 between point 36 of loop 32 and point 42 of loop 34 and the other conductor 49 between point 38 of loop 34 and point 40 of loop 32. This configuration for the electrical coupling of the pair of loops 32, 34 has the effect of causing the current induced in each loop by exposure of the loop pair to an E-field to cancel. As explained below, due to the symmetry of the loops 32, 34 the E-field induced current for each loop 32, 34 is substantially the same so that virtually a complete cancellation of the E-field induced current occurs.

Since the value of each resistor 50, 56 is $2R_1$ which is small compared to the loop impedance, each loop 32, 34 "sees" the parallel combination of both resistors, namely $R_1$. Consequently, the induced currents in each loop 32, 34 are not affected by the interconnection. Since the configuration of the loops 32, 34 is symmetrical with respect to each other and the values of the corresponding electrical elements are the same, the magnitudes of the voltages $v_{50}$ and $v_{56}$ across each resistor 50, 56 are equal:

$$v_{50}=-v_{56}=[(i_{H1}+i_{H2})+(i_{E1}-i_{E2})]R_1=v_o \quad (3)$$

where the indexes $H_1$, $H_2$, $E_1$ and $E_2$ refer to respective H- and E-field induced currents in each loop 32, 34. Given symmetrical loops 32, 34 with identities $i_{H1}=i_{H2}=i_H$ and $i_{E1}=i_{E2}=i_E$, the net voltage $v_o$ is inherently independent of E-field and purely a function of the H-field given in Equation 3:

$$v_o = 2R_1 i_H = 2v_H \quad (3)$$

where $v_H$ is the field response of the unbalanced loop 30 in Equation 1.

In theory, the balanced arrangement has an infinite E-field rejection. However, in practice, the symmetry will be limited by physical constraints.

For broadband applications, each loop 32, 34 also includes a square law detector, such as a beam lead Schottky diode 46, 60 connected in parallel with the series configuration of capacitors 48, 52, 54, 58 and the resistor 50, 56. Physical symmetry and reverse polarity, shown in FIG. 3, must be preserved.

In narrowband and single frequency applications, a suitable balun feedline may alternatively be used in lieu of the measuring circuit 65 and diodes 46, 60 to increase the dynamic range of the H-field detector circuit 19. The balun feedline would be connected between the midpoints of coupling conductors 47, 49.

Figure 4:
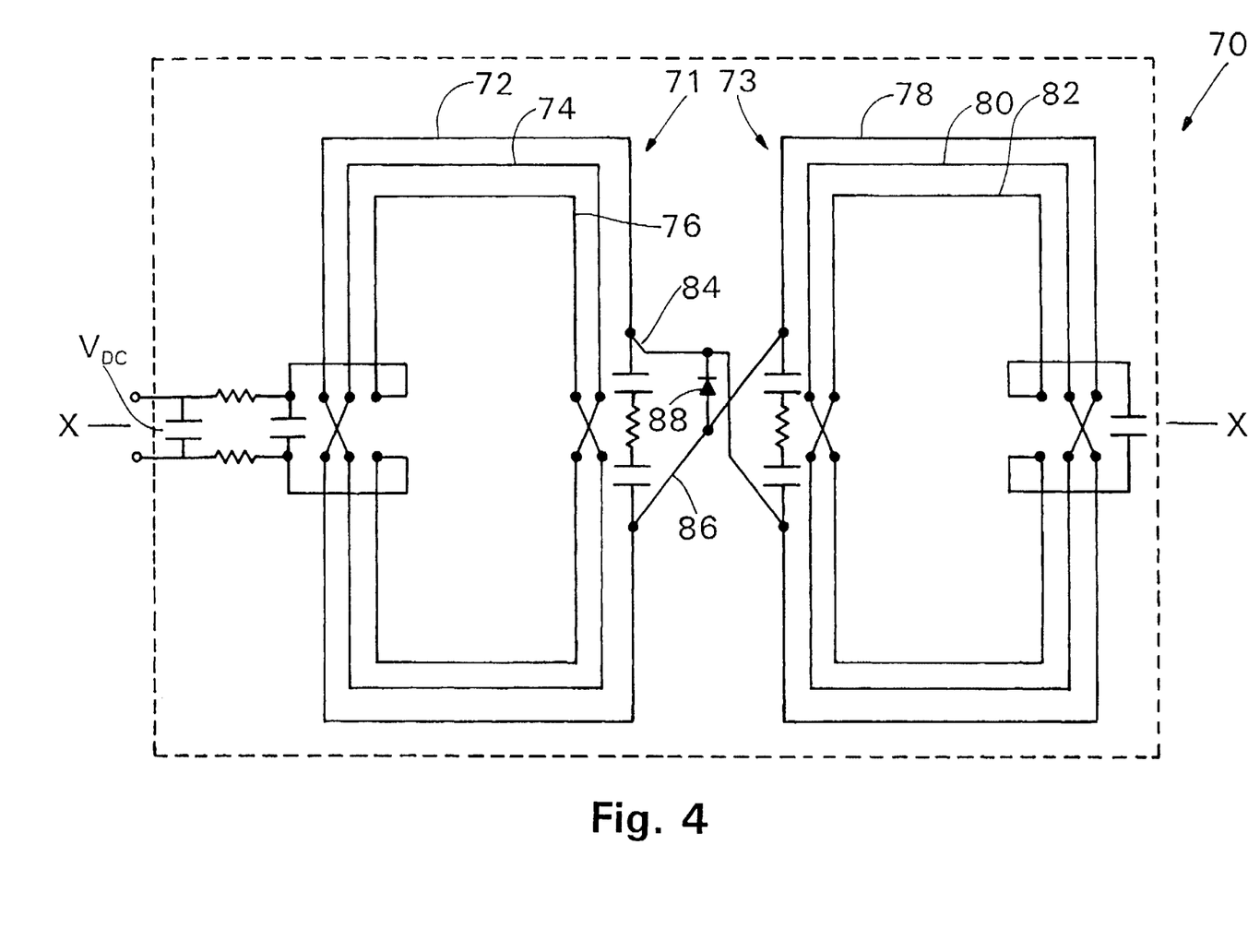
FIG. 4 is a alternative embodiment of a pair of symmetrical planar magnetic loops made in accordance with the teachings of the present invention.

As will be recognized to those of ordinary skill in the art, a variety of alternatives can be employed in the configuration of the detection circuit 19. For example, the pair of diodes 46, 54 in FIG. 3 can be replaced by a single diode 88 connected between the midpoints of conductors 84, 86 as shown in FIG. 4. The use of a chip diode is most suitable for this arrangement, as it best preserves the symmetry requirement.

Additionally, the configuration of the loops 32, 34 is not limited as long as symmetry is maintained. For example in FIG. 4, a pair of loops 71, 73 are shown comprising a series of nested loops 72, 74, 76, 78, 80, 82. While it is preferred that the loops 71, 73 be mounted adjacent to each other, they can be superimposed over each other.

The physical symmetry of the loops 71, 73 is the most critical issue for optimum performance of the H-field probe 18. In the prior discussion, the E-field was shown as polarized along the longer sides of the loop 30 as shown in FIG. 2. When the E-field is polarized in the perpendicular direction, along the X–X' axis shown in FIG. 2, then the potentials at points 22 and 24 are equal as long as the loop has a symmetry along the X–X' axis and the field is uniform. No E-field induced current will flow through the resistor $R_1$. A single-turn loop has inherently such a symmetry. However, in a planar implementation of a multi-turn loop the X–X' symmetry is not always readily obtained. An example of an implementation of a multi-turn loop with proper symmetry is shown in FIG. 4. The values of the resistors 73, 79 are 14Ω, whereas the values of the remaining electrical components shown in FIG. 4 are the same as in the prior embodiment.

Although the aforementioned embodiments operate effectively at a single frequency or over a relatively narrow range of frequencies, the frequency response of a loop is ultimately limited by the condition that the loop remain electrically small. As long as the loop is electrically small, a predictable relationship exists between the current induced in the loop and the magnetic field being measured. When the circumference of a loop is no longer electrically small, the sensor will begin to exhibit frequency sensitivity variations.

Figure 6:
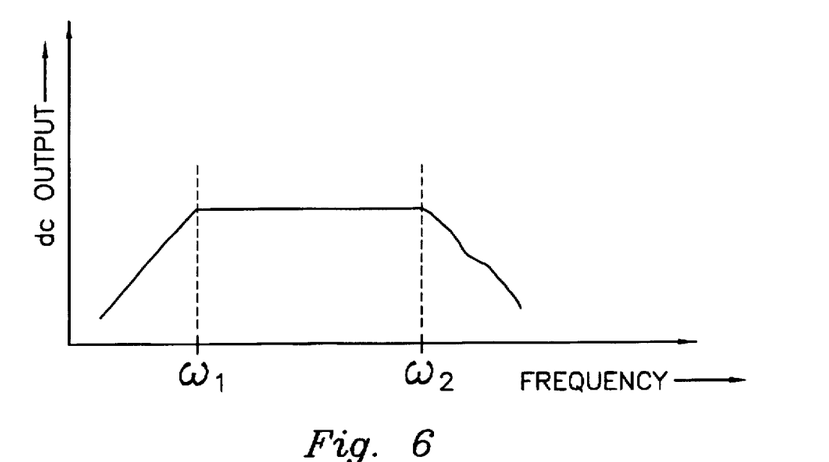
FIG. 6 is the frequency response of the embodiment of FIG. 3.

The typical frequency response of an H-field sensor having a single loop, or paired loops of the same size, is shown in FIG. 6. The loop will exhibit a frequency independent response from $\omega_1$ to $\omega_2$. The sensor will operate effectively if the desired frequency range of the sensor is between $\omega_1$ and $\omega_2$. However, extended bandwidth operation is often desired.

One solution for extending the operating bandwidth of a sensor is to reduce the circumference of the loop. However, the dc output voltage is generally proportional to the square of the area of the loop. Accordingly, a reduction in the circumference, and thus the area, of the loop results in an undesired reduction in the sensitivity of the sensor.

Figure 7:
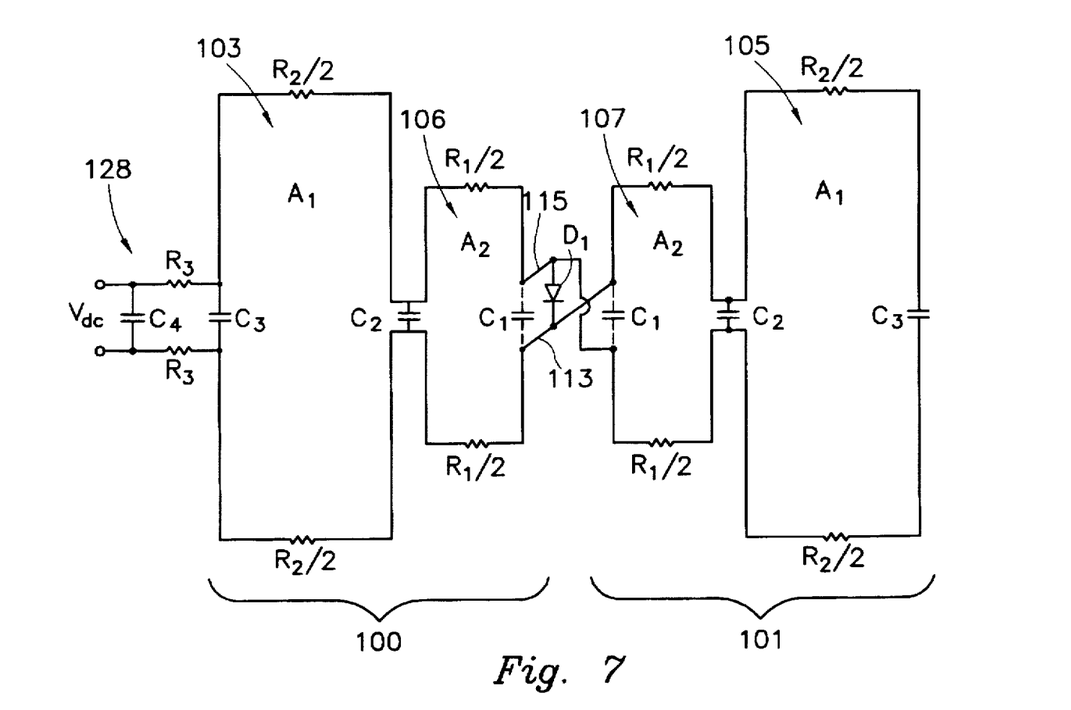
FIG. 7 is the preferred embodiment of the present invention employing two pairs of loops, each pair having a different circumference.

The preferred embodiment of the present invention is shown in FIG. 7. In this embodiment, an H-field sensor has four loops, comprising two pairs of loops 100, 101. The first pair 100 comprises a small loop 106 and a large loop 103 which are coupled by a capacitor C2 to provide an extended frequency response as will be described in detail. The second pair 101 is identical to the first pair 100. The two pairs of loops 100, 101 are electrically coupled by conductors 113, 115, a diode D1 and capacitors C1 such that the contribution of the E-field from the first loop pair 100 is canceled by the contribution of the E-field from the second loop pair 101. This provides the sensor with improved E-field discrimination. A dc measuring circuit 128 comprising two resistors R3 and a capacitor C4 is connected to the loops pairs 100, 101. Capacitors C1 and C3 are used to avoid shorting the detected dc voltage $V_{dc}$.

The area A1 of the large loops 103, 105 should be selected to be much greater than the area A2 of the small loops 106, 107. In the preferred embodiment, for example, area A1 is approximately ten times area A2.

The selection of the coupling capacitors C2 is critical to the operation of the present invention to couple and decouple the loop pairs 100, 106 depending upon the frequency of the measured H-field. The value of the capacitors C2 is selected such that the impedance of the capacitors C2 is very high at low frequencies, (thus acting as an open circuit), and the impedance is very low at high frequencies, (thus acting as a short circuit). The frequency dependent response of the capacitors C2 enables the coupling and decoupling of the loop pairs 100, 106 at pre-selected frequencies.

Referring again to FIG. 7, each coupling capacitor C2 will act as an open circuit at lower frequencies. Since area A1 is much greater than area A2, the contribution of the larger loops 103, 105 to the dc output will be much greater than that of the smaller loops 106, 107, which will be negligible. Accordingly, the frequency response of the sensor will approximate the frequency response of the large loops 103, 105 only.

As the sensor is exposed to higher frequencies, the large loops 103, 105 will no longer remain electrically small and the frequency response of the large loops 103, 105 begins to exhibit frequency sensitive variations. However, each coupling capacitor C2 will act as a short circuit to decouple the large loops 103, 105. At higher frequencies, the only contribution to the overall dc output will be from the small loops 106, 107 and the frequency response of the sensor will approximate that of the small loops 106, 107.

Figure 8:
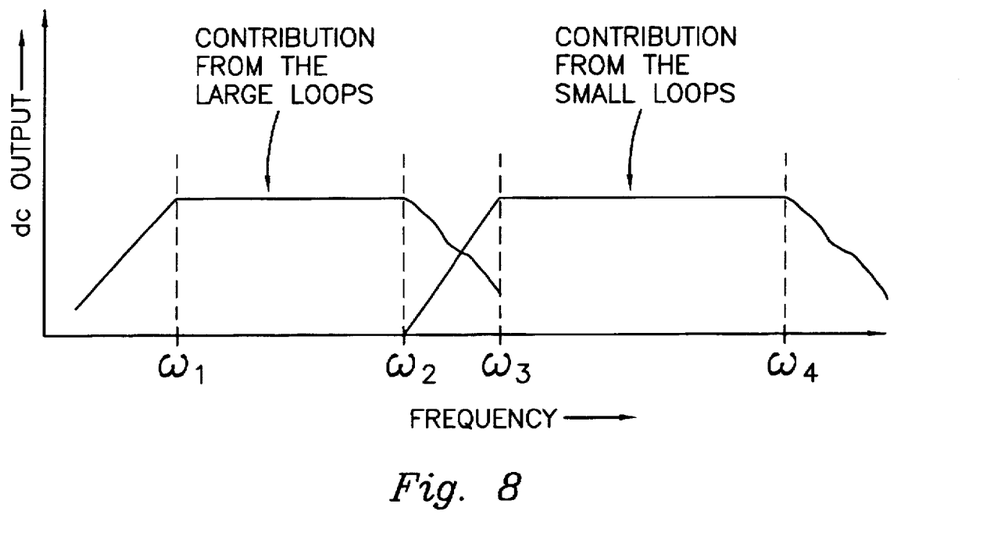
FIG. 8 is the frequency response of the embodiment of FIG. 7.

Referring to FIG. 8, the frequency response of the sensor of FIG. 7 is shown. The frequency response is a composite of the contributions of the large loops 103, 105 and the small loops 106, 107. At low frequencies the output from the large loops 103, 105 dominates the overall dc output since the contribution from the small loops 106, 107 is negligible. Between $\omega_1$ and $\omega_2$, the larger loops 103, 105 exhibit a frequency independent response. At $\omega_2$ the loops 103, 105 begin to exhibit frequency sensitivity variations since they are no longer electrically small. These variations are eliminated from the dc output by the coupling capacitors C2 which become a short circuit at $\omega_3$. Additionally, at $\omega_3$, the smaller loops 106, 107 exhibit a frequency independent response which dominates the overall dc output. The response remains frequency independent until $\omega_4$, when the output from the small loops 106, 107 begins to exhibit frequency sensitivity variations since the loops 106 are no longer electrically small.

It would be appreciated by those of skill in the art that the selection of loop size and component values will depend upon the desired operating bandwidth of the sensor. In the preferred embodiment, the operating bandwidth of the sensor is 50 MHZ-2.5 GHz and the values of the components are shown in Table 2.

TABLE 2

| ELEMENT | VALUE |
|---------|-------|
| R1 | 600 Ω |
| R2 | 2048 Ω |
| R3 | 25,000 Ω |
| C1 | 1.25 pf |
| C2 | 1.5 pf |
| C3 | 300 pf |
| C4 | 10,000 pf |
| D1 | FSI 99159.00 |

It should be noted that R1 and R2 are distributed as resistive lines over the perimeter of the loops. Additionally, capacitance C1 is part of the junction capacitance of diode D1.

Figure 9:
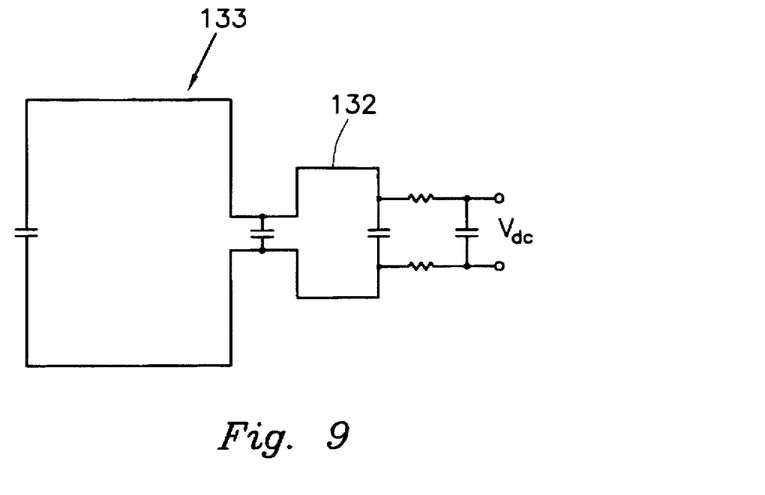
FIG. 9 is an alternative embodiment of the present invention employing two loops, each having a different circumference.

FIG. 9 is an alternative embodiment of the invention that includes two loops 130, 132, each loop having a different circumference. This embodiment of the invention does not have a matching pair of loops to cancel the E-field current contribution. Accordingly, this embodiment does not have the inherent E-field discrimination as in the preferred embodiment.

Figure 10A:
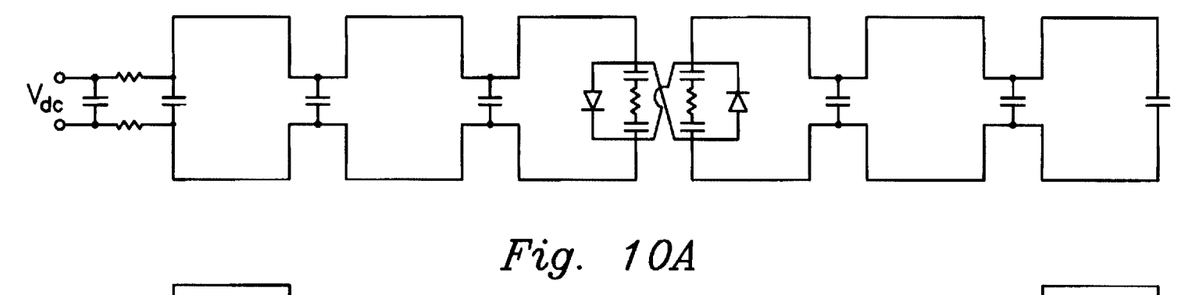
FIGS. 10A and 10B are alternative embodiments of the present invention having alternative loop configurations.
Figure 10B:
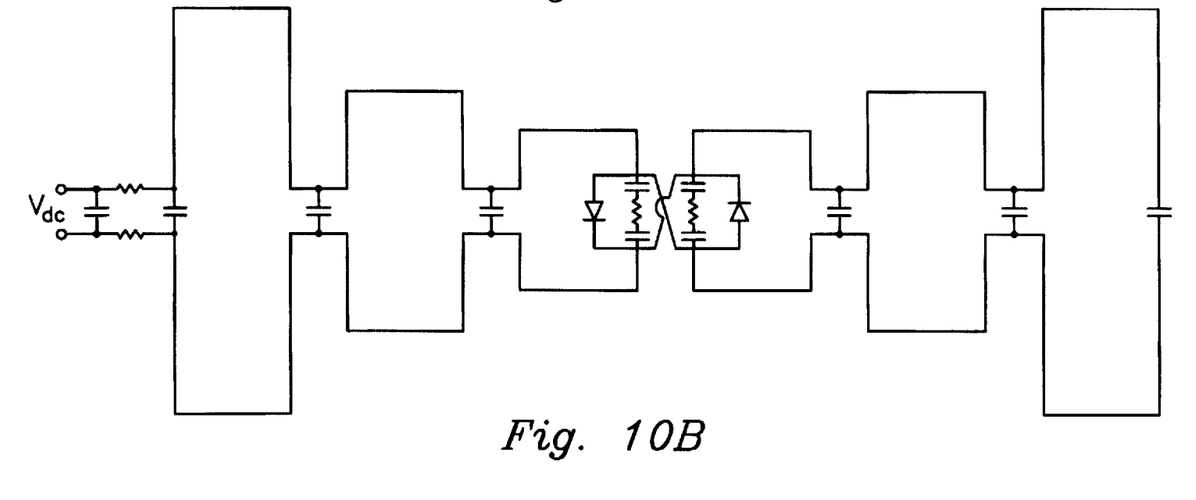

Those of skill in the art, taking into account the teachings herein, would appreciate that various other arrangements of loops, as shown in FIGS. 10A and 10B, may be envisioned to change the frequency response of the H-field sensor. For example, as shown in FIG. 10A, multiple loops of the same size may be capacitively coupled. Additionally, as shown in FIG. 10B, multiple loops of different sizes may also be capacitively coupled to form a sensor with extended operating range.

Figure 11:
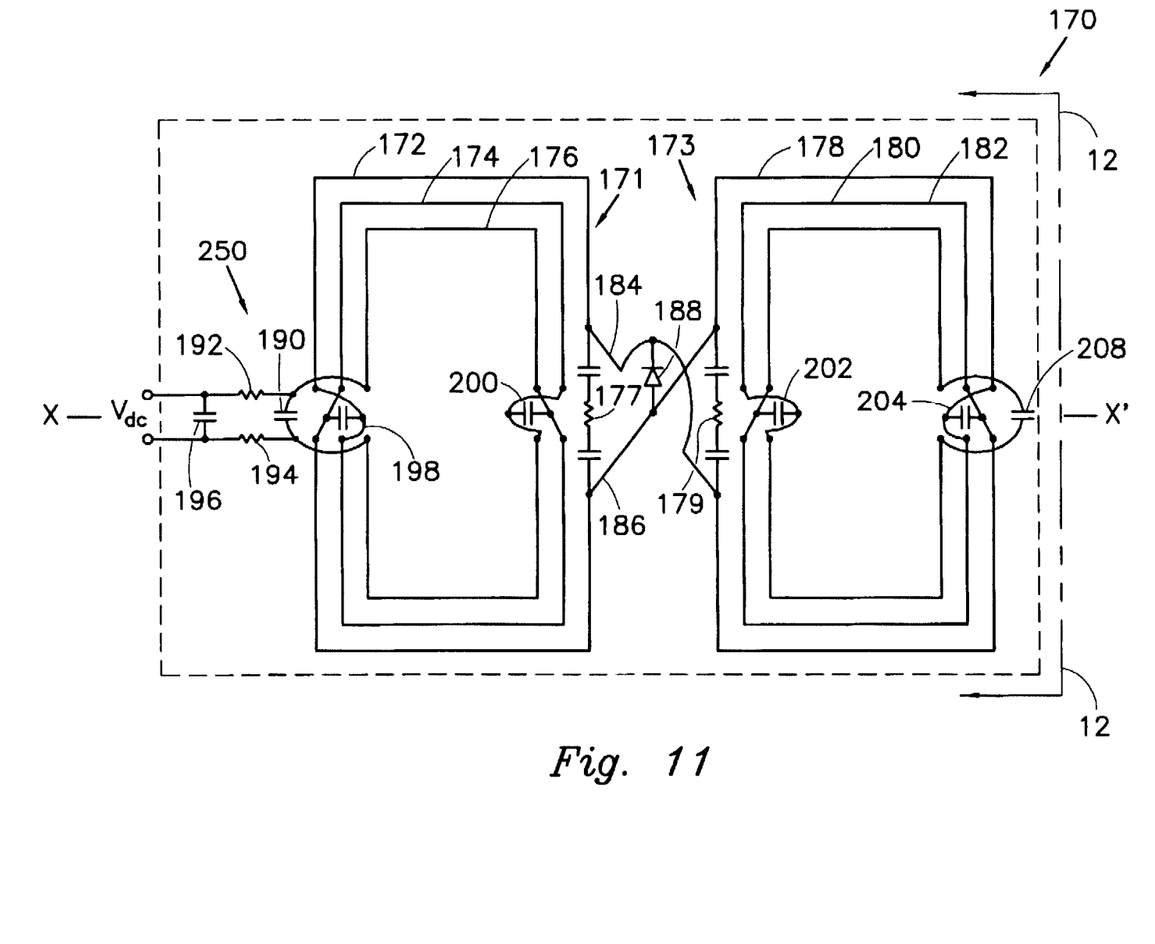
FIG. 11 is a schematic view of an alternative embodiment including a series of nested loops.
Figure 12:
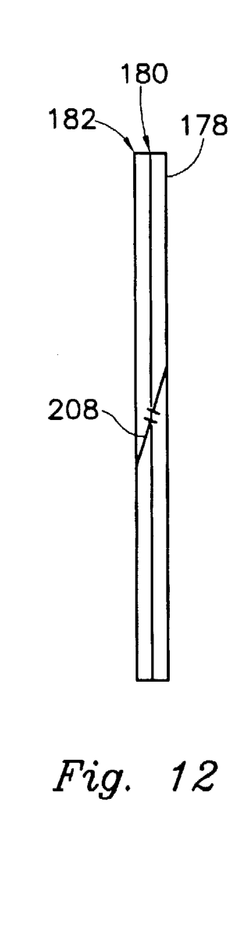
FIG. 12 is a side view of the embodiment of FIG. 11.

Referring to FIG. 11, an alternative embodiment 170 of the present invention is shown which comprises a series of nested loops 172, 174, 176, 178, 180, 182. As with all of the aforementioned embodiments, it is important that the X-X' symmetry of the loops be maintained for optimum operation of the sensor. Preferably, as shown in FIG. 12 the loops 172, 174, 176, 178, 180, 182 within each loop pair 171, 173 are superimposed over each other in a stacked planar arrangement, whereby a minimum planar separation is provided. Planar separation may be provided, for example, by adhering the loops to opposing sides of a printed circuit board. Although the dc measuring circuit 250 is located across capacitor 190, it may be placed at any location which maintains the symmetry of the loop pairs. For example, the dc measuring circuit 250 may also be placed across diode 188 or capacitor 208.

Figure 5:
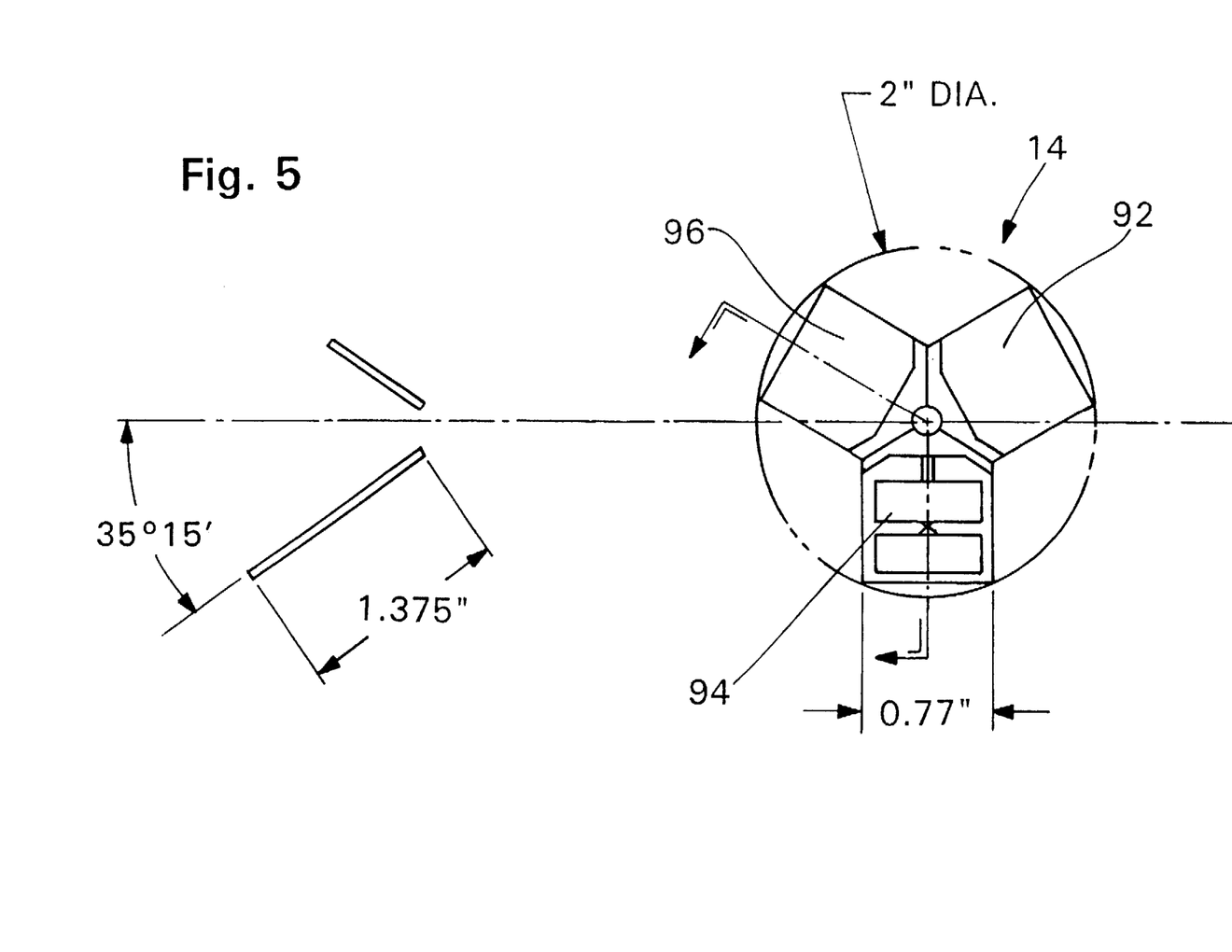
FIG. 5 is a schematic illustration of a plurality of symmetric magnetic loop pairs assembled in an H-field probe made in accordance with the teachings of the present invention.

As shown in FIG. 5, the preferred embodiment of the H-Probe includes three detecting circuits 92, 94, 96 mounted equally spaced, but in different planes, within the probe head 14. The planar orientation of the detector circuits 92, 94, 96 with respect to each other is selected such that an accurate H-field measurement is obtained irrespective of the angle of propagation of the electromagnetic radiation which is being measured. As will be recognized by those of ordinary skill in the art, different configurations are suitable depending upon whether isotropic or anisotropic response is desired. FIG. 5 depicts an isotropic probe configuration where the planar orientation of each of the detector circuits 92, 94, 96 is 35° 15' from an axis perpendicular to the plane of the figure.

Although the invention has been described in part by making detailed reference to certain specific embodiments, such detail is intended to be instructive rather than restrictive. It will be appreciated by those skilled in the art that many variations may be made in the structure and mode of operation without departing from the spirit and scope of the invention as disclosed in the teachings herein.

What is claimed is:

1. A magnetic field probe comprising:

first and second symmetrical electrical detecting means mounted in close proximity defining a symmetric detecting pair in a fixed relationship to each other; said detecting means comprising at least two electrical loops having means for capacitively coupling said loops, each loop having a different circumference;

means for electrically coupling said first and second detecting means such that:

a current induced in said first detecting means from exposure of said detecting pair to an electric field is offset by the current induced in said second detecting means from exposure of said detecting pair to the electric field; and a current induced in said first detecting means from exposure of said detecting pair to a magnetic field is combined with the current induced in said second detecting means from exposure of said detecting pair to the magnetic field; and lead means for measuring the current induced in said detecting pair from exposure of said detecting pair to an electromagnetic field whereby the measurement is substantially equal to the amount of current induced by the magnetic field portion of the electromagnetic field.

2. A magnetic field probe according to claim 1 wherein said coupled detecting pair is substantially planar.

3. An isotropic probe according to claim 2 further comprising at least three substantially planar coupled detecting pairs having a common mount at one end and radiating outwardly in different planes.

4. A magnetic field probe according to claim 2 wherein said loops are substantially rectangular and wherein said coupling means comprises a pair of conductors.

5. A magnetic field probe according to claim 4 wherein each said loop comprises a single rectangle.

6. A magnetic field probe according to claim 4 wherein each said loop comprises a plurality of rectangular sub-loops.

7. A magnetic field probe according to claim 4 wherein said means for capacitively coupling said loops is a frequency sensitive capacitor.

8. A magnetic field probe according to claim 4 further comprising at least one square law detector associated with said lead means for measuring current induced by an EM field.

9. A magnetic field probe according to claim 8 wherein said square law detector comprises a single diode electrically coupled between the midpoints of a pair of coupling conductors.

10. The system of claim 1 wherein each said electrical loop comprises an inductive loop.

11. A radiation measuring system comprising:

a probe including:

first and second symmetrical electrical detecting means mounted in close proximity defining a symmetric detecting pair in a fixed relationship to each other;

said detecting means comprising at least two electrical loops having means for capacitively coupling said loops, each loop having a different circumference;

means for electrically coupling said first and second detecting means such that:

a current induced in said first detecting means from exposure of said detecting pair to an electric field is offset by the current induced in said second detecting means from exposure of said detecting pair to the electric field; and a current induced in said first detecting means from exposure of said detecting pair to a magnetic field is combined with the current induced in said second detecting means from exposure of said detecting pair to the magnetic field; and lead means for measuring the current induced in said detecting pair from exposure of said detecting pair to an electromagnetic field whereby the measurement is substantially equal to the amount of current induced by the magnetic field portion of the electromagnetic field; and a radiation meter coupled with said lead means of said probe.

12. The system of claim 11 wherein aid coupled detecting pair is substantially planar.

13. The system of claim 12 further comprising at least three substantially planar coupled detecting pairs having a common mount at one end and radiating outwardly in different planes.

14. The system of claim 12 wherein said loops are substantially rectangular and wherein said coupling means comprises a pair of conductors.

15. The system of claim 14 wherein each said loop comprises a single rectangle.

16. The system of claim 14 wherein each said loop comprises a plurality of rectangular sub-loops.

17. The system of claim 14 wherein said means for capacitively coupling said loops is a frequency sensitive capacitor.

18. The system of claim 14 further comprising at least one square law detector associated with said lead means for measuring current induced by an EM field.

19. The system of claim 18 wherein said square law detector comprises a single diode electrically coupled between the midpoints of a pair of coupling conductors.

20. The system of claim 11 wherein each said electrical loop comprises an inductive loop.

* * * * *

UNITED STATES PATENT AND TRADEMARK OFFICE
CERTIFICATE OF CORRECTION

PATENT NO. : 5,777,470
DATED : July 7, 1998
INVENTOR(S) : Adler et al.

It is certified that error appears in the above-identified patent and that said Letters Patent is hereby corrected as shown below:

Column 6, line 9, delete "C2" and insert therefor --102--.

Claim 12, column 9, line 25, after "wherein" delete "aid" and insert therefor --said--.

Signed and Sealed this

Twenty-fourth Day of November, 1998

Attest:

BRUCE LEHMAN

Attesting Officer

Commissioner of Patents and Trademarks

UNITED STATES PATENT AND TRADEMARK OFFICE
CERTIFICATE OF CORRECTION

PATENT NO. : 5,777,470
DATED : July 7, 1998
INVENTOR(S) : Adler et al.

It is certified that error appears in the above-identified patent and that said Letters Patent is hereby corrected as shown below:

Column 3, line 58, delete $$"V_E = jwC_aL_1w_1l_1/2E"$$

and insert therefor $$--V_E = jwC_aL_1w_1\frac{l_1}{2}E--.$$

Claim 12, column 9, line 25, after "wherein" delete "aid" and insert --said--.

This certificate supersedes Certificate of Correction issued November 24, 1998.

Signed and Sealed this

Sixteenth Day of March, 1999

Attest:

Q. TODD DICKINSON

Attesting Officer

Acting Commissioner of Patents and Trademarks